United States Patent
Seamons et al.

(10) Patent No.: US 8,513,129 B2
(45) Date of Patent: Aug. 20, 2013

(54) PLANARIZING ETCH HARDMASK TO INCREASE PATTERN DENSITY AND ASPECT RATIO

(75) Inventors: Martin Jay Seamons, San Jose, CA (US); Kwangduk Douglas Lee, Redwood City, CA (US); Chiu Chan, Foster City, CA (US); Patrick Reilly, San Jose, CA (US); Sudha Rathi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 380 days.

(21) Appl. No.: 12/790,203

(22) Filed: May 28, 2010

(65) Prior Publication Data

US 2011/0291243 A1 Dec. 1, 2011

(51) Int. Cl.
*H01L 21/311* (2006.01)
*H01L 23/58* (2006.01)

(52) U.S. Cl.
USPC ........... 438/694; 257/629; 257/E21.215; 257/E29.022

(58) Field of Classification Search
None
See application file for complete search history.

(56) References Cited

U.S. PATENT DOCUMENTS

| | | | |
|---|---|---|---|
| 5,013,680 | A | 5/1991 | Lowery et al. |
| 5,328,810 | A | 7/1994 | Lowery et al. |
| 7,298,024 | B2 | 11/2007 | Yin et al. |
| 7,413,990 | B2 | 8/2008 | Ye et al. |
| 7,659,158 | B2 | 2/2010 | Ma et al. |
| 2008/0272467 | A1 | 11/2008 | Bok et al. |
| 2010/0092891 | A1 | 4/2010 | Tran et al. |

FOREIGN PATENT DOCUMENTS

KR 1020080002060 1/2008

OTHER PUBLICATIONS

International Search Report and Written Opinion Dated Jan. 2, 2012 for International Application No. PCT/US2011/034163.
"Applied Producer APF (Advanced Patterning Film) PECVD," (www.appliedmaterials.com/products/producer_apf_4.html), p. 1, 2013.
Dielectrics, "Applied Producer APF™ and DARC®, Litho-Enabling Patterning Films" (www.appliedmaterials.com <http://www.appliedmaterials.com/>), pp. 1-4, 2013.
Alain C. Diebold, "Taking Measurement Technology to the Quantum Level," Semiconductor International, Aug. 1, 2009 (www.semiconductor.net), pp. 1-7.
Alex Paiken, "VLSI Basics," National Semiconductor, Apr. 2003, Hitequest, (www.hitequest.com), pp. 1-4.
Paul Zimmerman, "Double Patterning Lithography: Double the Trouble or Double the Fun?, " Micro/Nano Lithography & Fabrication, SPIE Publications (www.spie.org), pp. 1-3, Jul. 20, 2009.

*Primary Examiner* — N Drew Richards
*Assistant Examiner* — Valerie N Newton
(74) *Attorney, Agent, or Firm* — Patterson & Sheridan, LLP

(57) ABSTRACT

Methods for manufacturing a semiconductor device are provided. In one embodiment, a method includes providing a base material having a first film stack deposited thereon, wherein the base material is formed over the substrate and has a first set of interconnect features. The first film stack comprises a first amorphous carbon layer deposited on a surface of the base material, a first anti-reflective coating layer deposited on the first amorphous carbon layer, and a first photoresist layer deposited on the first anti-reflective coating layer. The first photoresist layer is patterned by shifting laterally a projection of a mask on the first photoresist layer relative to the substrate a desired distance, thereby introducing into the first photoresist layer a first feature pattern to be transferred to the underlying base material, wherein the first feature pattern is not aligned with the first set of interconnect features.

13 Claims, 9 Drawing Sheets

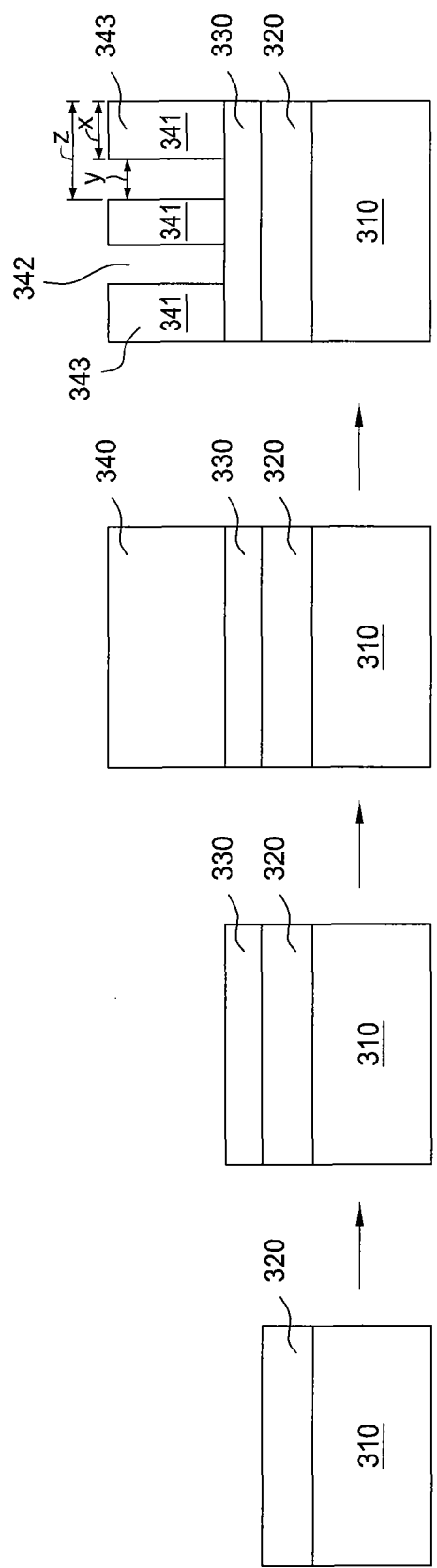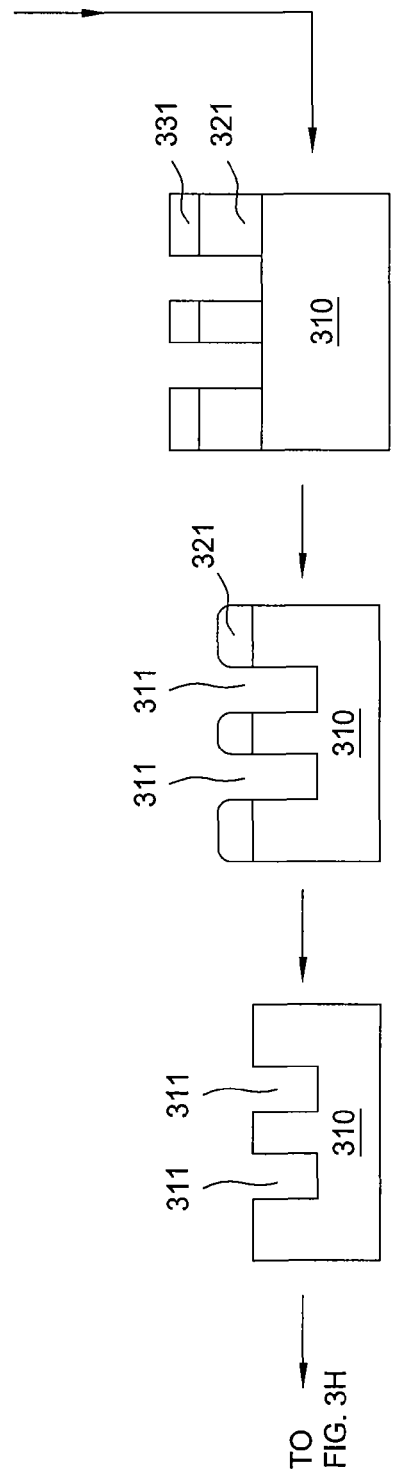

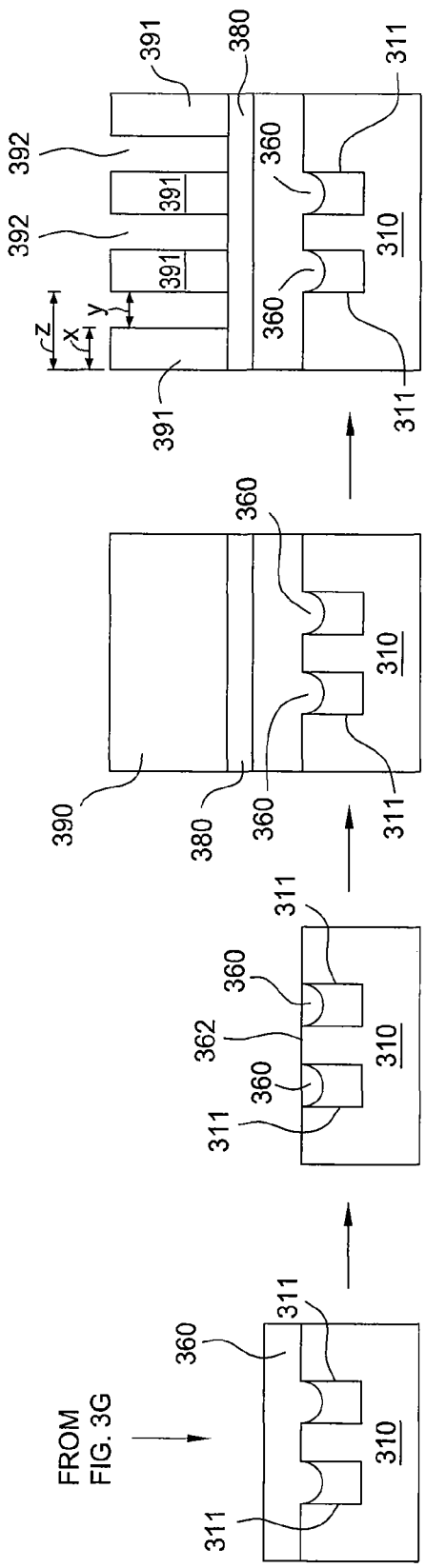

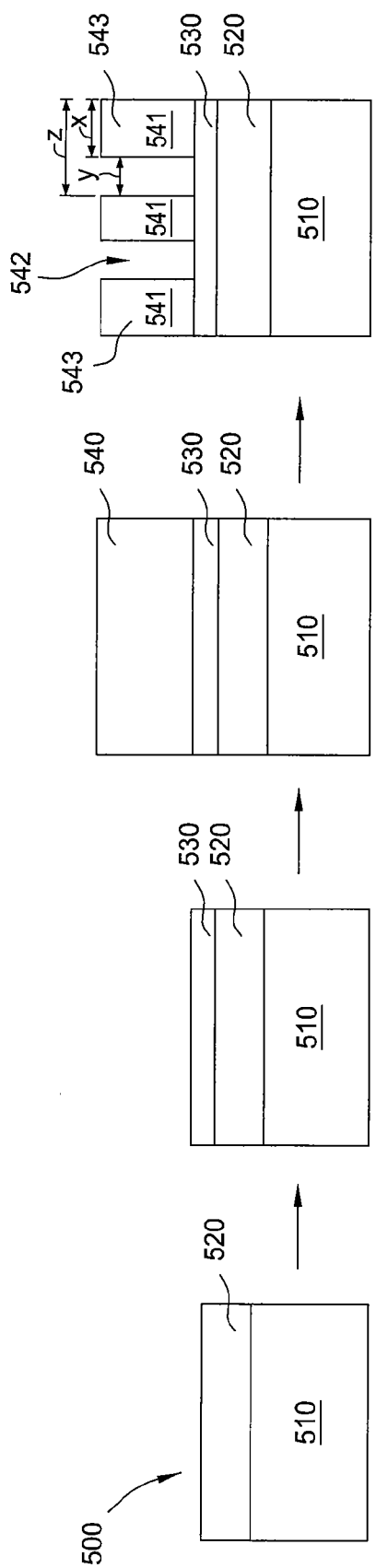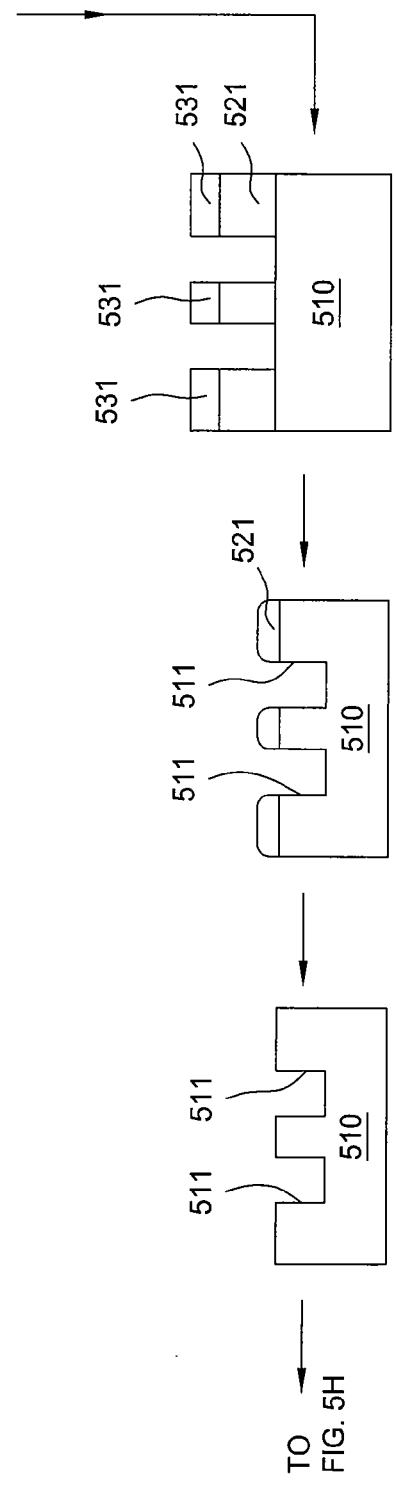

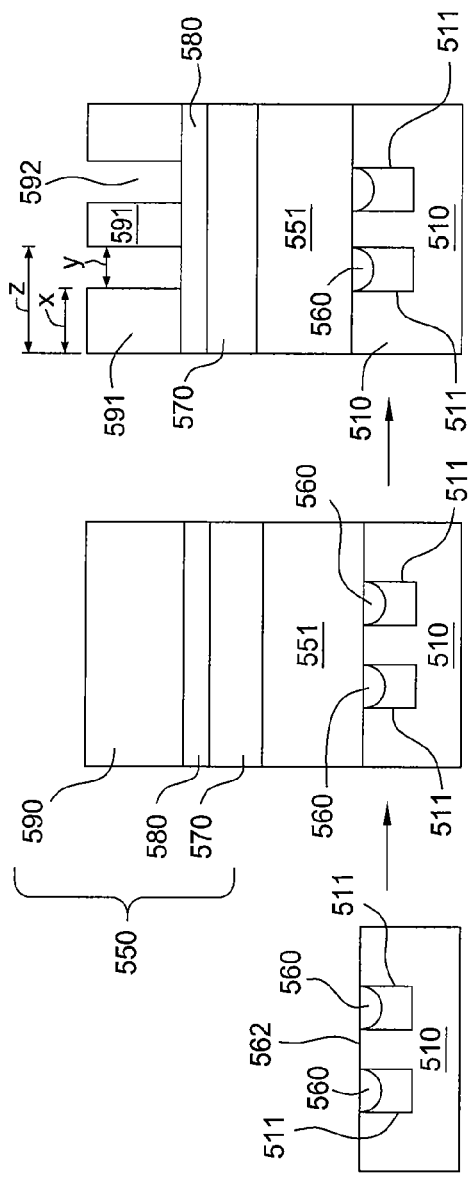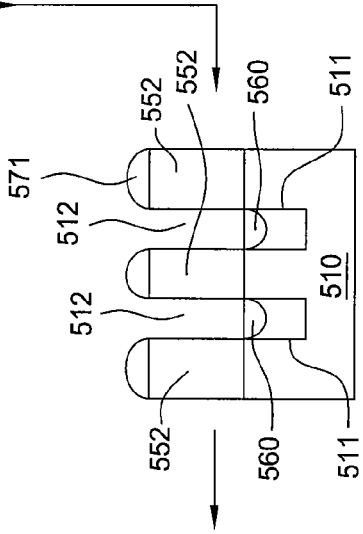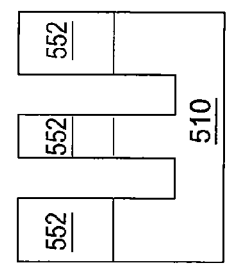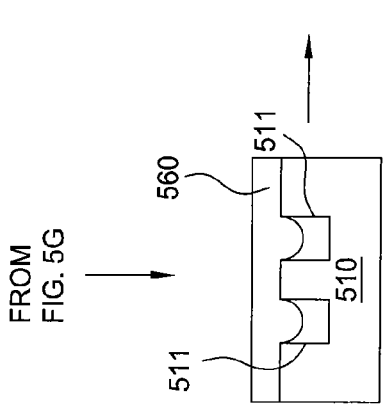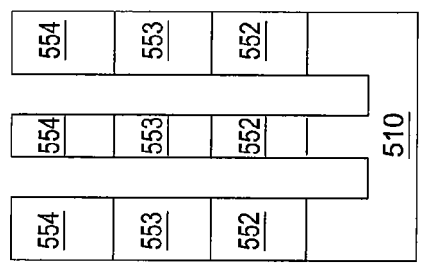

PLANARIZING ETCH HARDMASK TO INCREASE PATTERN DENSITY AND ASPECT RATIO

BACKGROUND OF THE INVENTION

1. Field of the Invention

Embodiments of the present invention generally relate to the fabrication of integrated circuits and particularly to planarizing etch hardmask processes for obtaining an increased aspect ratio feature in a desired film stacks or increasing the pattern density for a given region.

2. Description of the Related Art

Integrated circuits have evolved into complex devices that can include millions of transistors, capacitors and resistors on a single chip. The evolution of chip design continually requires faster circuitry and greater circuit density. The demand for faster circuits with greater circuit densities imposes corresponding demands on the materials used to fabricate such integrated circuits.

Hardmasks are being used for almost every step in integrated circuit manufacturing processes for both front-end and back-end processes. As device sizes shrink and pattern structure becomes more complex and difficult to manufacture, an etch hardmask is becoming more important as photoresists currently available are failing to meet the etching resistance requirements and photoresists are simply being used for image transfer rather than as an etch mask in a lithography and etching process. Instead hardmasks that receive the image pattern are becoming the primary material for effective etching of patterns in underlying layers.

Amorphous hydrogenated carbon is a material that may be used as a hardmask for metals, amorphous silicon, and dielectric materials, such as silicon dioxide or silicon nitride materials, among others. Amorphous hydrogenated carbon, also referred to as amorphous carbon, is typically used as an etch hardmask in semiconductor applications due to its high chemical inertness, optical transparency, and easy removal. The continued reduction in device geometries has generated a demand for methods of forming nanometer scale features that are separated by nanometer scale distances on semiconductor substrates. However, as the minimum feature size decreases, the semiconductor industry is facing the limitation of patterning sub-32 nm due to the limits of optical resolution being approached in current lithography processes. Meanwhile, there has always been a great demand for a device with an increased circuit density and/or high aspect ratio structures in order to achieve higher device performance.

Therefore, there is a need for improved patterning processes which are capable of increasing the pattern density for a given region or obtaining an increased aspect ratio feature in a desired film stacks for semiconductor applications.

SUMMARY OF THE INVENTION

Embodiments of the present invention provide a semiconductor device and a method for manufacturing a semiconductor device in a processing chamber. In one embodiment the method includes depositing over a substrate a first base material having a first set of interconnect features, filling an upper portion of the first set of interconnect features with an ashable material to an extent capable of protecting the first set of interconnect features from subsequent processes while being easily removable when desired, planarizing an upper surface of the first base material such that an upper surface of the ashable material filled in the first set of interconnect features is at the same level with the upper surface of the first base material, providing a substantial planar outer surface of the first base material, depositing a first film stack comprising a second base material on the substantial planar outer surface of the first base material, forming a second set of interconnect features in the second base material, wherein the second set of interconnect features are aligned with the first set of interconnect features, and removing the ashable material from the first base material, thereby extending a feature depth of the semiconductor device by connecting the second set of interconnect features to the first set of interconnect features.

In another embodiment the method includes depositing over a substrate a first base material having a first set of interconnect features formed therein, filling the first set of interconnect features with an ashable material to an extent capable of protecting the first set of interconnect features from subsequent processes while being easily removable when desired, planarizing an upper surface of the first base material such that an upper surface of the ashable material filled in the first set of interconnect features is at the same level with the upper surface of the first base material, providing a substantial planar outer surface of the first base material, depositing a first film stack on the first base material, the first film stack comprising a second base material deposited on the substantial planar outer surface of the first base material, a first amorphous carbon layer deposited on the second base material, a first anti-reflective coating layer deposited on the first amorphous carbon layer, and a first photoresist layer deposited on the first anti-reflective coating layer, introducing into the first photoresist layer an image of a first pattern to be transferred to the underlying second base material, wherein the first pattern is aligned with the first set of interconnect features in the first base material, transferring the first pattern to the first anti-reflective coating layer using the first photoresist layer as a mask, and transferring the first pattern through the first amorphous carbon layer into the second base material using the first amorphous carbon layer as a hardmask, thereby forming a second set of interconnect features in the second base material.

In yet another embodiment, the method includes providing a base material having a first film stack deposited thereon, wherein the base material is formed over the substrate and having a first set of interconnect features filled with an amorphous carbon material, the first film stack comprising a first amorphous carbon layer deposited on a surface of the base material, a first anti-reflective coating layer deposited on the first amorphous carbon layer, and a first photoresist layer deposited on the first anti-reflective coating layer, and patterning a portion of the first photoresist layer by shifting laterally a projection of a mask on the first photoresist layer relative to the substrate a desired distance, thereby introducing into the first photoresist layer a first feature pattern to be transferred to the underlying base material, wherein the first feature pattern is not aligned with the first set of interconnect features.

In one another embodiment, a semiconductor device is provided. The semiconductor includes a substrate having a base material deposited thereon, wherein the base material has a set of interconnect features in which an upper portion of the set of interconnect features is filled with an ashable material to provide a substantial planar outer surface of the base material, a patterned amorphous carbon layer formed on the base material, the patterned amorphous carbon layer has a first feature pattern being aligned with the set of interconnect features, and a patterned anti-reflective coating layer formed on the patterned amorphous carbon layer, the patterned amorphous carbon layer has a second feature pattern being aligned with the set of interconnect features.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3N depict a sequence of schematic, cross-sectional views of a film stack using the sequence illustrated in FIG. 2;

FIGS. 5A-5N depict a sequence of schematic, cross-sectional views of a film stack using the sequence illustrated in FIG. 4.

DETAILED DESCRIPTION

Embodiments of the present invention generally provide an improved patterning process for pattern density doubling in a desired film stacks for various applications such as metal contacts, source/drain contacts, capacitor, or shallow trench isolations. Embodiments described below also provide a planarizing etch hardmask process for improving integrated circuit device performance by nearly doubling aspect ratio of interconnect features in a desired height of film stacks.

Exemplary Hardware

Figure 1:
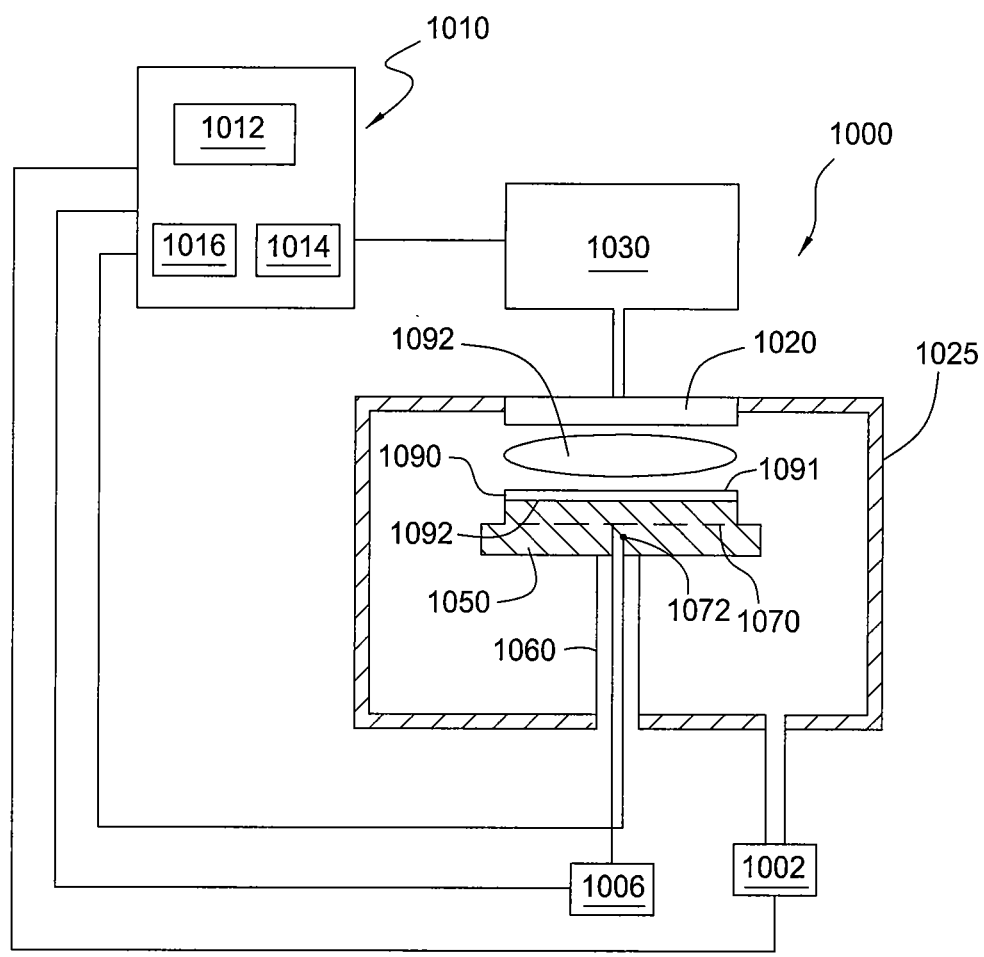
FIG. 1 is a schematic representation of a substrate processing system that can be used to perform amorphous carbon layer deposition according to embodiments of the invention.

FIG. 1 is a schematic representation of a substrate processing system, system 1000, which can be used for features and/or amorphous carbon layer deposition according to embodiments of the present invention. Examples of suitable systems include the CENTURA® systems which may use a DxZ™ processing chamber, PRECISION 5000® systems, PRODUCER™ systems, such as the PRODUCER SE™ processing chamber and the PRODUCER GT™ processing chamber, all of which are commercially available from Applied Materials, Inc., Santa Clara, Calif.

System 1000 includes a process chamber 1025, a gas panel 1030, a control unit 1010, and other hardware components such as power supplies and vacuum pumps. Details of one embodiment of the system used in the present invention are described in a commonly assigned U.S. patent "High Temperature Chemical Vapor Deposition Chamber", U.S. Pat. No. 6,364,954, issued on Apr. 2, 2002, which is hereby incorporated by reference herein.

The process chamber 1025 generally comprises a support pedestal 1050, which is used to support a substrate such as a semiconductor substrate 1090. This pedestal 1050 moves in a vertical direction inside the process chamber 1025 using a displacement mechanism (not shown) coupled to shaft 1060. Depending on the process, the substrate 1090 can be heated to a desired temperature prior to processing. The substrate support pedestal 1050 is heated by an embedded heater element 1070. For example, the pedestal 1050 may be resistively heated by applying an electric current from an AC supply 1006 to the heater element 1070. The substrate 1090 is, in turn, heated by the pedestal 1050. A temperature sensor 1072, such as a thermocouple, is also embedded in the substrate support pedestal 1050 to monitor the temperature of the pedestal 1050. The measured temperature is used in a feedback loop to control the power supply 1006 for the heating element 1070. The substrate temperature can be maintained or controlled at a temperature that is selected for the particular process application.

A vacuum pump 1002 is used to evacuate the process chamber 1025 and to maintain the proper gas flows and pressure inside the process chamber 1025. A showerhead 1020, through which process gases are introduced into process chamber 1025, is located above the substrate support pedestal 1050 and is adapted to provide a uniform distribution of process gases into process chamber 1025. The showerhead 1020 is connected to a gas panel 1030, which controls and supplies the various process gases used in different steps of the process sequence. Process gases may include a hydrocarbon source and a plasma-initiating gas and are described in more detail below in conjunction with a description of an exemplary argon-diluted deposition process.

The gas panel 1030 may also be used to control and supply various vaporized liquid precursors. While not shown, liquid precursors from a liquid precursor supply may be vaporized, for example, by a liquid injection vaporizer, and delivered to process chamber 1025 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 1020 and substrate support pedestal 1050 may also form a pair of spaced electrodes. When an electric field is generated between these electrodes, the process gases introduced into chamber 1025 are ignited into a plasma 1092. Typically, the electric field is generated by connecting the substrate support pedestal 1050 to a source of single-frequency or dual-frequency radio frequency (RF) power (not shown) through a matching network (not shown). Alternatively, the RF power source and matching network may be coupled to the showerhead 1020, or coupled to both the showerhead 1020 and the substrate support pedestal 1050.

PECVD techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas and liquid flows through the gas panel 1030 is performed by mass flow controllers (not shown) and a controller unit 1010 such as a computer. The showerhead 1020 allows process gases from the gas panel 1030 to be uniformly distributed and introduced into the process chamber 1025. Illustratively, the control unit 1010 comprises a central processing unit (CPU) 1012, support circuitry 1014, and memories containing associated control software 1016. This control unit 1010 is responsible for automated control of the numerous steps required for substrate processing, such as substrate transport, gas flow control, liquid flow control, temperature control, chamber evacuation, and so on. When the process gas mixture exits the showerhead 1020, plasma enhanced thermal decomposition of the hydrocarbon compound occurs at the surface 1091 of the heated substrate 1090, resulting in the deposition of an amorphous carbon layer on the substrate 1090.

Deposition Process for Pattern Density Doubling in Film Stack

Figure 2:
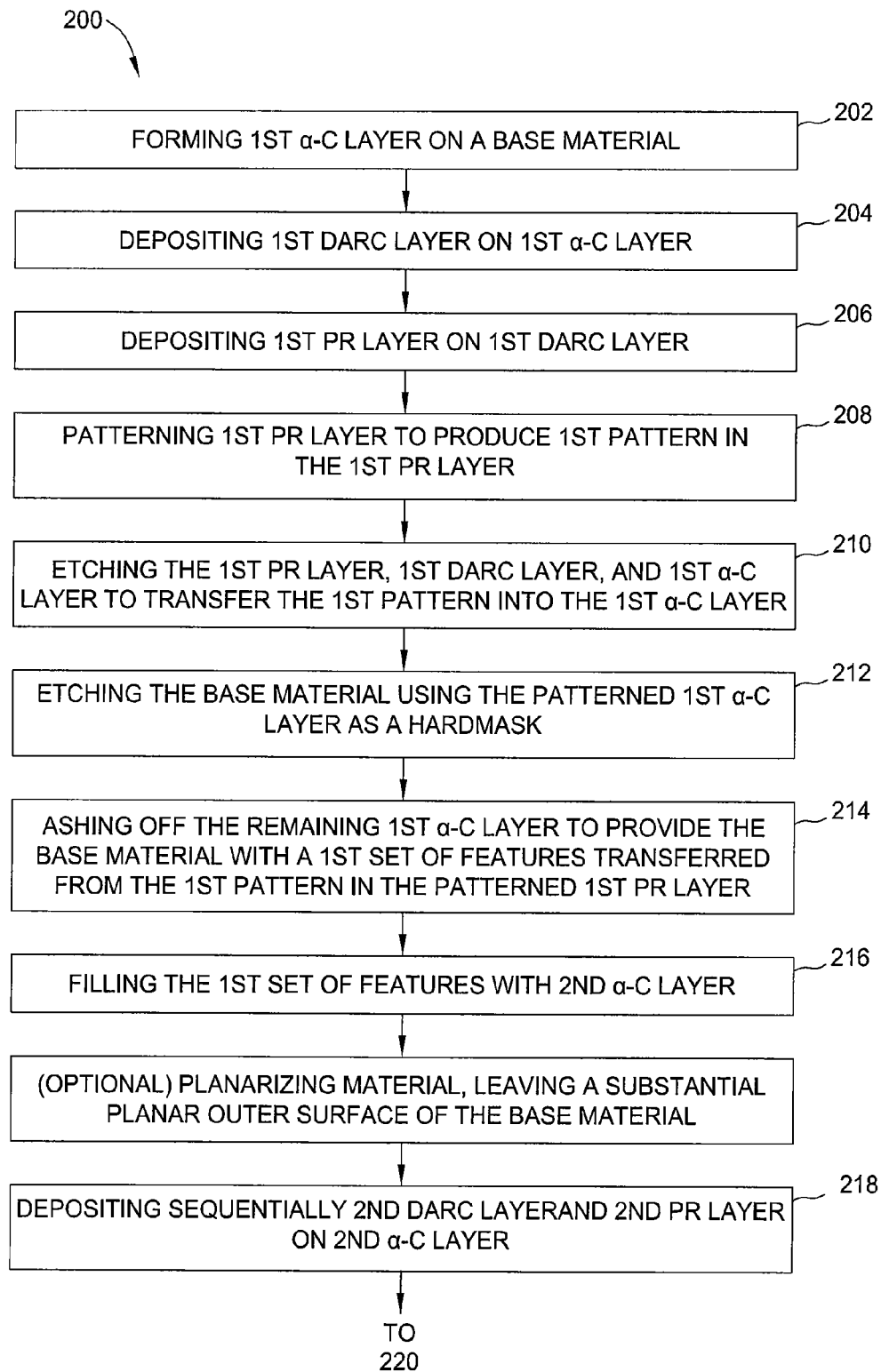
FIG. 2 depicts a flow diagram of a deposition process according to one embodiment of the invention for doubling of the pattern density for a given region in a desired film stack.
Figure 2:
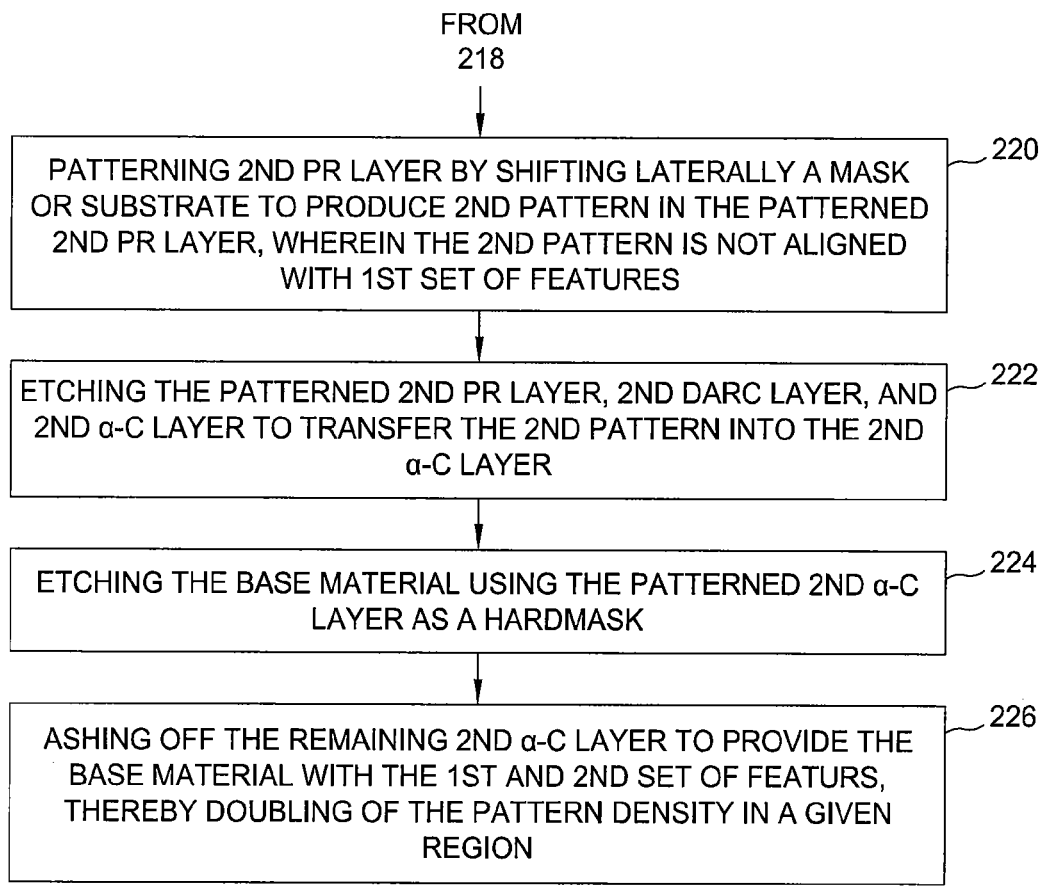

Embodiments of the present invention generally provide patterning processes for doubling of the pattern density for a given region in a film stack for various applications such as metal contacts, source/drain contacts, capacitor, or shallow trench isolations. FIG. 2 depicts a flow diagram of a deposition process 200 according to one embodiment of the present invention for doubling of the pattern density for a given region in a desired film stack for various applications such as metal contacts, source/drain contacts, capacitor, or shallow trench isolations. FIGS. 3A-3N depict a sequence of schematic, cross-sectional views of a film stack using the deposition process 200. It should be noted that the number and sequence of steps illustrated in FIG. 2 are not intended to limiting as to the scope of the invention described herein, since one or more steps can be added, deleted and/or reordered without deviating from the basic scope of the invention described herein. In addition, the drawings are not drawn to scale, and the proportions of certain features and the layer thickness have been exaggerated to better illustrate details and features of the invention.

The deposition process 200 starts at step 202 where a first amorphous carbon layer 320 is deposited on a desired base material 310, as shown in FIG. 3A. While the base material 310 is illustrated as a single body, it is understood that the base material 310 may be one or more materials used in forming semiconductor devices such as metal contacts, trench isolations, gates, bitlines, or any other interconnect features. The base material is generally deposited over a substrate (not shown) and may include an oxide material, a nitride material, a polysilicon material, or the like, depending upon application. Alternatively, the substrate may be part of the base material. In one embodiment where a memory application is desired, the base material 310 may include the silicon substrate material, an oxide material, and a nitride material, with or without polysilicon sandwiched in between. In another embodiment where a DRAM capacitor application is desired, the base material 310 may include a plurality of alternating oxide and nitride materials (i.e., oxide-nitride-oxide (ONO)) deposited on a surface of the substrate (not shown). The substrate may be any substrate or material surface upon which film processing is performed. For example, the substrate may be a material such as crystalline silicon, silicon oxide, strained silicon, silicon germanium, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, or other suitable workpieces.

The first amorphous carbon (α-C) layer 320 may be an Advanced Patterning Film™ (APF) material commercially available from Applied Materials, Inc. of Santa Clara, Calif. Amorphous carbon layer here is used as an etch hardmask, due to its high etch resistance and easy removal characteristics. In one embodiment, the first amorphous carbon layer 320 is formed by introducing a hydrocarbon source having a carbon to hydrogen atom ratio of 1:2 or greater, such as a carbon to hydrogen ratio of 2:3 or greater, an optional dilution gas, and a plasma-initiating gas selected from the group of helium, hydrogen, nitrogen, argon, into a process chamber, such as processing chamber 1025 described above in conjunction with FIG. 1. In one embodiment, the hydrocarbon source is a mixture of one or more hydrocarbon compounds, and, optionally a carrier gas, such as argon. It has been observed by the present inventor that the process conditions as will be described below enable the first amorphous carbon layer 320 deposition to fill or partially fill holes, trenches (or other interconnect features) before pitching off above the features.

In one embodiment, the hydrocarbon compounds may be partially or completely doped derivatives of hydrocarbon compounds, including nitrogen-, fluorine-, oxygen-, hydroxyl group-, and boron-containing derivatives of hydrocarbon compounds. In one embodiment, the hydrocarbon compounds or derivatives thereof that may be included in the hydrocarbon source may be described by the formula $C_xH_y$, where x has a range of between 1 and 20 and y has a range of between 1 and 20. In one example, $C_2H_2$ is preferable due to formation of more stable intermediate species which allows more surface mobility. In another embodiment, the hydrocarbon compounds or derivatives thereof that may be included in the hydrocarbon source may be described by the formula $C_xH_yF_z$, where x has a range of between 1 and 24, y has a range of between 0 and 50, and z has a range of 0 to 50, and the ratio of x to y+c is 1:2 or greater. In yet another embodiment, the hydrocarbon source may be described by the formula $C_aH_bO_cF_dN_e$ for oxygen and/or nitrogen substituted compounds, where a has a range of between 1 and 24, b has a range of between 0 and 50, c has a range of 0 to 10, d has a range of 0 to 50, e has a range of 0 to 10, and the ratio of a to b+c+d+e is 1:2 or greater.

Suitable hydrocarbon compounds include one or more of the following compounds, for example, alkanes methane ($CH_4$), ethane ($C_2H_6$), propane ($C_3H_8$), butane ($C_4H_{10}$) and its isomer isobutane, pentane ($C_6H_{12}$) and its isomers isopentane and neopentane, hexane ($C_6H_{14}$) and its isomers 2-methylpentane, 3-methylpentane, 2,3-dimethylbutane, and 2,2-dimethyl butane, and so on. Additional suitable hydrocarbons may include alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. Also, alkynes such as acetylene ($C_2H_2$), propyne ($C_3H_4$), butylene ($C_4H_8$), vinylacetylene and derivatives thereof can be used as carbon precursors. Additionally aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like can be used.

Suitable dilution gases such as helium (He), argon (Ar), hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. In some cases, the addition of $N_2$ and/or $NH_3$ can be used to control the hydrogen ratio of the amorphous carbon layer. Alternatively, dilution gases may not be used during the deposition.

In certain embodiments, the first amorphous carbon layer 320 deposition process includes the use of a plasma-initiating gas that is introduced into the chamber at before and/or same time as the hydrocarbon compound and a plasma is initiated to begin deposition. The plasma-initiating gas may be a high ionization potential gas including to, and not limited to, helium gas, hydrogen gas, nitrogen gas, argon gas and combinations thereof, of which helium gas is preferred. The plasma-initiating gas may also be a chemically inert gas, such as helium gas, nitrogen gas, or argon gas is preferred. Suitable ionization potentials for gases are from about 5 eV (electron potential) to 25 eV. The plasma-initiating gas may be introduced into the chamber before the nitrogen containing hydrocarbon source and/or the hydrocarbon source, which allows a stable plasma to be formed and reduces the chances of arcing. The use of the plasma-initiating gas with high ionization potential has been observed to provide for less anisotropic etching of film during deposition thereby improving conformality in amorphous carbon film deposition. An inert gas used as a dilution gas or a carrier gas, such as argon, may be introduced with the plasma-initiating gas, the nitrogen containing hydrocarbon source, the hydrocarbon source, or combinations thereof.

The hydrocarbon compound and dilution gas may be introduced at a hydrocarbon compound to dilution gas flow ratio from about 1:100 or greater, for example, from about 1:100 to 100:1, such as from about 1:10 to about 10:1 for the amorphous carbon deposition. In one embodiment, the hydrocarbon compound to dilution gas flow ratio may be from about 1:5 or greater, such as from about 1:5 to about 2:1, for example, from about 1:2 to about 1:1, may be used for the amorphous carbon deposition. Increasing hydrocarbon compound to dilution gas flow ratio has been observed to provide improved conformality over lower ratios.

The first amorphous carbon layer 320 may be deposited from the processing gas by maintaining a chamber pressure of about 500 mTorr to 20 Torr, such as from about 2 Torr to about 15 Torr, for example, from about 7 Torr to about 9 Torr. It has been observed that conformality increases with increasing pressures and it is believed that ions experience more scattering before reaching the substrate, thereby losing some ability to etch and radicals which experience more scattering and arrive at the substrate surface an angle that is more random and isotropic for a more isotropic and conformal film growth.

The first amorphous carbon layer 320 may be deposited from the hydrocarbon source in a chamber maintaining a substrate temperature from about 0° C. to about 800° C., such as at a temperature from about 0° C. to about 100° C. or at a temperature from about 180° C. to about 650° C., for example, from about 200° C. to about 480° C. It has been observed that depositing amorphous carbon film at increasing temperatures reduces the deposition rate and hence improves conformality. Also, at increasing temperature, the diffusivity or mobility of adsorbed carbon precursor is increasing, leading to more isotropic deposition and improved conformality.

The hydrocarbon source and a plasma-initiating gas are introduced into the chamber and a plasma is initiated to begin deposition. A dual-frequency RF system may be used to generate the plasma. A dual frequency RF power application is believed to provide independent control of flux and ion energy, since it is believed that the energy of the ions hitting the film surface influences the film density. It is believed that the high frequency plasma controls plasma density and a low frequency plasma controls kinetic energy of the ions hitting the substrate surface. A dual-frequency source of mixed RF power provides a high frequency power in a range from about 10 MHz to about 60 MHz, for example, about 13.56 MHz, as well as a low frequency power in a range of from about 10 KHz to about 1 MHz, for example, about 350 KHz. When a dual frequency RF system is used to deposit the first amorphous carbon layer 320, the ratio of the second RF power to the total mixed frequency power is preferably less than about 0.6 to 1.0 (0.6:1). The applied RF power and use of one or more frequencies may be varied based upon the substrate size and the equipment used. A single frequency RF power application may be used, and is typically, an application of the high frequency power as described herein.

Plasma may be generated by applying RF power at a power density to substrate surface area of from about 0.01 W/cm² to about 5 W/cm², such as from about 0.01 to about 1 W/cm². For example, the power application may be from about 1 Watt to about 2000 watts, such as from about 10 W to about 200 W, for example, about 20 W to about 75 W for a 300 mm substrate. Electrode spacing, i.e., the distance between the substrate and the showerhead, may be from about 200 mils to about 1000 mils, for example, 300 mils.

While not wishing to be bounded by any particular theory, it is believed that plasma process reduces amorphous carbon deposition rates to improve the conformality by reducing the number of energetic ions, making hydrocarbon compounds, i.e., radicals, arriving at the substrate surface with a more random deposition pattern, thereby providing the resulting film growth with a more isotropic deposition pattern. The reduced plasma deposition is also observed to provide a lower deposition rate that allows for adsorbed carbon precursors to diffuse on a surface of a desired target and provide a more conformal layer. In one particular example used to deposit the amorphous carbon hardmasks in various embodiments of this disclosure, the plasma is generated by applying RF power at a power density to substrate surface area of between about 0.7 W/cm² and about 100 W/cm², for example, about 70-75 W/cm². A hydrocarbon source using $C_2H_2$ is introduced into the processing chamber where the flow rate of $C_2H_2$ is about 1500 sccm to 4000 sccm, for example, about 2400 sccm. The flow rate of the plasma-initiating gas using helium is about 2500 sccm to about 6000 sccm, for example, about 4800 sccm. The electrode spacing is between about 200 mils and about 1000 mils, for example, about 300 mils. In addition, the chamber pressure is maintained between about 2 Torr and about 20 Torr, for example, about 9-12 Torr, and the substrate temperature is maintained between about 100° C. and about 450° C., for example, about 300° C.

In one embodiment of the deposition process, a plurality of individual amorphous carbon depositions may be performed to form the first amorphous carbon layer 320. In one aspect of the multiple deposition process, a deposition step, such as described herein, is followed by a pause step, in which dilution gas and/or precursor can be flown with a reduced or no deposition rate. A suitable dilution gas and/or precursor can be flown into the chamber at a flow rate from about 100 sccm to about 40000 sccm. A plasma may be initiated for the pause step if the dilution gas is used. The deposition and pause steps may then be repeated until a desired thickness is obtained and may be from 1 to 100 cylces, such as from 10 to 50 cycles, for example 30 cycles, or alternatively deposited between about 1% to about 100% of the thickness of the amorphous carbon material, such as from about 2% to about 10% cycles, for example about 3.3%. An individual cycle may deposit amorphous carbon material from about 1 Å to about 1000 Å thickness for each cycle to form an amorphous carbon layer having a thickness from about 10 Å to about 15000 Å. The cyclical deposition process may use one or more of the above described process parameter adjustments. Alternatively, gases can also be pumped out and flown again before the deposition step or during the pause step.

It is believed that a multi-layer deposition scheme lowers effective film deposition rate, improving conformality of the amorphous carbon material. Also, newly deposited carbon atoms can diffuse during the pause step, improving conformality yet more. In general, conformality is improved when the number of layers increases for a given amorphous carbon film thickness (smaller individual layer thickness and more repetition) and when the ratio of pause step time to deposition step time is higher (low effective deposition rate). For example, the ratio of pause step time to deposition step time may be from about 100:1 to about 1:100. By adjusting the individual layer thickness and pause-to-deposition time ratio, the conformality of amorphous carbon layer can be tailored to meet the device need, hence providing another knob to improve conformality for a given PECVD deposition condition (precursor, gas, flow rate, pressure, temperature, RF power, etc.)

More examples of the amorphous carbon deposition that may be used for practicing the present invention are described in a commonly assigned U.S. patent application Ser. No. 12/577,455, filed Oct. 12, 2009, entitled "METHOD FOR DEPOSITING CONFORMAL AMORPHOUS CARBON FILM BY PLASMA-ENHANCED CHEMICAL VAPOR DEPOSITION (PECVD)", which is hereby incorporated by reference in its entirety.

At step 204, after the first amorphous carbon layer 320 is deposited on the base material 310, a first anti-reflective coating material 330 is deposited on the first amorphous carbon layer 320 as shown in FIG. 3B. The first anti-reflective coating material 330 is used to control the reflection of light during a lithographic patterning process. The first anti-reflective coating material 330 may comprise silicon dioxide, silicon oxynitride, silicon nitride, or combinations thereof. The first anti-reflective coating material 330 may be a DARC™ material layer commercially available from Applied Materials, Inc. of Santa Clara, Calif.

At step 206, after deposition of the first anti-reflective coating material 330, a first photoresist (PR) layer 340 is then deposited on the first anti-reflective coating material 330 as shown in FIG. 3C.

At step 208, the first photoresist layer 340 is then patterned by a lithographic process to produce a first pattern 342 in the patterned first photoresist layer 341 as shown in FIG. 3D. The first photoresist layer 340 is generally exposed through a mask, developed, and the undeveloped portion of the photoresist is removed. The photoresist layer is generally a carbon-based polymer that remains as an etch mask on top of the first anti-reflective coating material 330 that is intended to be protected during an etch process. It is noted that the pitch as shown in this description is for illustrative purpose and should not be considered as a limit to the present invention. The patterned first photoresist layer 341 may have a desired line width "x" and a desired space "y" which together define the pitch "z" (i.e., line width plus space). For example, in one embodiment, the width "x" of the patterned first photoresist layer 341 may substantially correlate with the desired critical dimension of a semiconductor device feature and may be between about 0.1 nanometers and about 100 nanometers. Also, the space "y" may be selected between about 0.3 nanometers and about 300 nanometers to optimize a frequency doubling scheme in conjunction with a second pattern 392 (see FIG. 3K). For example, if the frequency of features is to be doubled, the space "y" between each feature 343 in the patterned first photoresist layer 341 may be approximately equal to 3 times of the value width "x". If desired, the line width "x" of the patterned first photoresist layer 341 may optionally be reduced to a desired value using a photoresist mask trimming process, which may be a plasma process that uses an oxygen-based chemistry to perform isotropic etching of the photoresist. Similarly, the diameter or side length of the patterned first photoresist layer 341 may vary over a desired range. It is contemplated that the patterned first photoresist layer 341 may have any desired number of pitch in order to ultimately transfer a desired pattern into the base material 310.

At step 210, a so-called APF mask opening step is performed such that the first pattern 342 formed in the patterned first photoresist layer 341 is transferred to the first amorphous carbon layer 320 to form a patterned first amorphous carbon layer 321. This step may be achieved by first etching the patterned first photoresist layer 341, the first anti-reflective coating material 330, and then the first amorphous carbon layer 320 with one or more etching processes as shown in FIG. 3E. The patterned first amorphous carbon layer 321 may then perform as a hardmask for the underlying base material 310.

At step 212, the base material 310 is then etched using the patterned first amorphous carbon layer 321 as a hardmask with one or more etching processes or by a separate process to remove the remaining first anti-reflective coating material 331 and a portion of the base material 310. The resulting base material 310 has a first set of features 311, such as contact holes, transferred from the first pattern 342 in the patterned first photoresist layer 341 (FIG. 3D), with the remaining first amorphous carbon layer 321 deposited on the top surface of the base material 310, as shown in FIG. 3F.

At step 214, after completion of the etch, the remaining first amorphous carbon layer 321 is removed by a suitable technique such as an $O_2$ ash plus wet cleaning processes, resulting in the base material 310 with the first set of features 311 as shown in FIG. 3G.

At step 216, a second amorphous carbon layer 360 is deposited on the patterned based material 310 using a process similar to step 202 discussed above, thereby filling an upper portion of the first set of features 311 formed in the patterned based material 310 with the second amorphous carbon layer 360, as shown in FIG. 3H. The second amorphous carbon layer 360 is deposited to protect the first set of features 311 from the subsequent depositions and etch resistant while serving as a hardmask for the subsequent patterning step. The second amorphous carbon layer 360 should be easily removed when desired. Therefore, while the second amorphous carbon layer 360 can have full-hole filling capability to gapfill the first set of features 311, it is advantageous in certain applications to not completely plug the first set of features 311 for easy removal of the second amorphous carbon layer 360 in the later stage. In such a case, the second amorphous carbon layer 360 may only fill the upper portion or top half of the first set of features 311 that is suffice to close off the top portion of contact holes, as shown in FIG. 3H.

Alternatively or optionally, the excessive second amorphous carbon materials remained above the surface of the base material 310 may be removed by a suitable technique such as an ash process, thereby providing a substantial planar outer surface 362 of the base material 310 with the second amorphous carbon layer 360 filled the top half of the first set of features 311, as shown in FIG. 3I. In this example, an upper surface of the second amorphous carbon layer is at the same level with an upper surface of the base material 310 such that a substantial planar outer surface 362 is formed for uniform deposition of the subsequent film stacks.

At step 218, a second anti-reflective coating material 380 and a second photoresist layer 390 may be sequentially deposited on the second amorphous carbon layer 360, as shown in FIG. 3J, using the process similar to steps 202-206 discussed previously. The second anti-reflective coating material 380 and second photoresist layer 390 may be the same materials as deposited for the first anti-reflective coating material 330 and the first photoresist layer 340. Alternatively, if the excessive second amorphous carbon materials were previously removed from the surface of the base material 310, a third amorphous carbon layer (not shown) may be deposited prior to deposition of the second anti-reflective coating material 380 and the second photoresist layer 390 to serve as a hardmask for the subsequent patterning step.

At step 220, the second photoresist layer 390 is then patterned using a lithographic process by shifting laterally the projection of a mask (not shown) on the surface of the second photoresist layer 390 relative to the substrate (not shown) a desired distance, or shifting laterally the substrate relative to the mask, thereby creating a second pattern 392 in the second patterned photoresist layer 391, as shown in FIG. 3K. The second pattern 392 to be transferred to the underlying base material 310 is not aligned with the first set of features 311 due to lateral shifting of the mask or substrate, which allows for the frequency doubling of a lithographic pattern by creating additional features (e.g., contact holes) adjacent to the first set of features 311 in a given region. Refer to an example shown in FIG. 3N, the resulting base material 310 contains features 311, 312 with substantially the same pitch, in which each feature 311 is sandwiched between two features 312. It is contemplated that the patterned first and second photoresist layers 341, 391 may have any desired number of pitch to ultimately transfer a desired pattern into the base material 310 and optimize a frequency doubling scheme.

At step 222, the second pattern 392 formed in the patterned second photoresist layer 391 is transferred to the second amorphous carbon layer 360 formed above the surface of the base material 310 (or transferred to a third amorphous carbon layer (not shown) if the second amorphous carbon layer 360 formed above the surface of the base material 310 was previously removed) to form a patterned second amorphous carbon layer 361 by first etching the patterned second photoresist layer 391, the second anti-reflective coating material 380, and then the second amorphous carbon layer 360 with one or more etching processes, as shown in FIG. 3L. The patterned second amorphous carbon layer 361 may perform as a hardmask for the underlying base material 310. It is understood that a different reference numeral 361 is given here for illustrative purpose since the second amorphous carbon layer 360 contains a material that is identical to the patterned second amorphous carbon layer 361.

At step 224, the base material 310 is then etched using the patterned second amorphous carbon layer 361 as a hardmask with one or more etching processes to remove the remaining second anti-reflective coating material 381 and a portion of the base material 310. The resulting base material 310 therefore has the second set of features 312 transferred from the second pattern 392 in the patterned second photoresist layer 391 (FIG. 3K), with the patterned second amorphous carbon layer 361 remained on the top surface of the base material 310 along with the second amorphous carbon layer 360 filled in the upper portion of the first set of features 311, as shown in FIG. 3M.

At step 226, after completion of the etch, the second amorphous carbon layer 361 remained above the surface of the base material 310 and the second amorphous carbon layer 360 filled the top half of the first set of features 311 are removed together by a suitable technique such as an ash process, resulting in the base material 310 having the first set of features 311 and the second set of features 312, where the resulting first and second set of features 311, 312 are formed parallel and equally spaced from each other with substantially identical feature size in a given region, as shown in FIG. 3N. While the drawings are not drawn to scale as previously mentioned, it is to be understood that the contact features shown in FIG. 3N are further shrunk (relative to FIG. 3M or previous figures) for illustrative purpose.

One major advantage of the inventive patterning method is pattern density doubling in a given region, which offers superior device performance as compared to those achieved through current photolithographic processes for sub-32 nm hole patterning. It is contemplated that the number of pitch in the first and second photoresist layers 341, 391 may vary in order to optimize a desired frequency doubling scheme. While not wishing to be bounded by any particular theory, it is believed that the process as described above may continue until a desired frequency of features is obtained in the base material.

Planarizing Etch Hardmask Process for Obtaining High Aspect Ratio Structure

Figure 4:
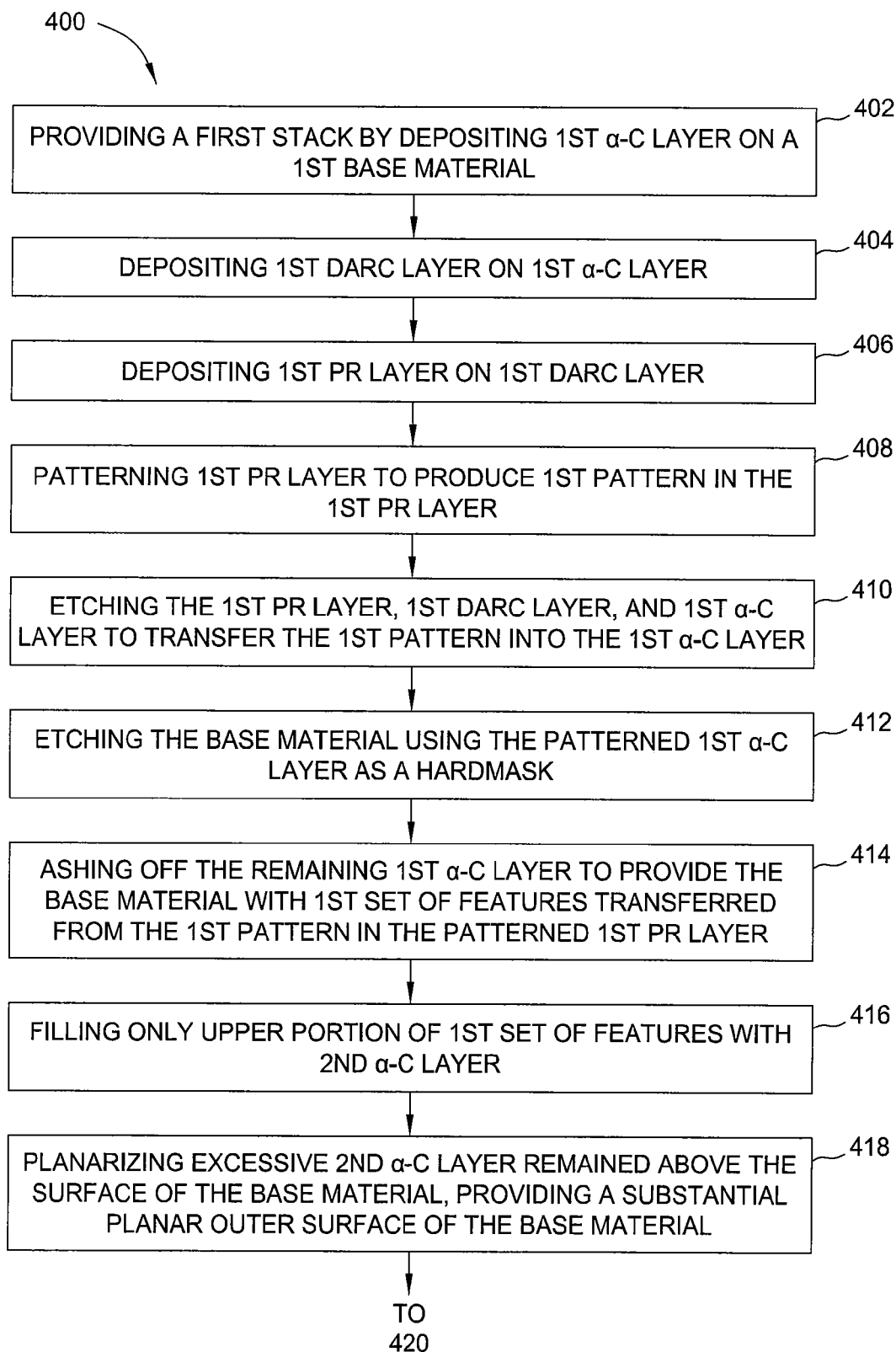
FIG. 4 depicts a flow diagram of a deposition process 400 according to one embodiment of the present invention for obtaining interconnect features with a high aspect ratio in desired film stacks.
Figure 4:
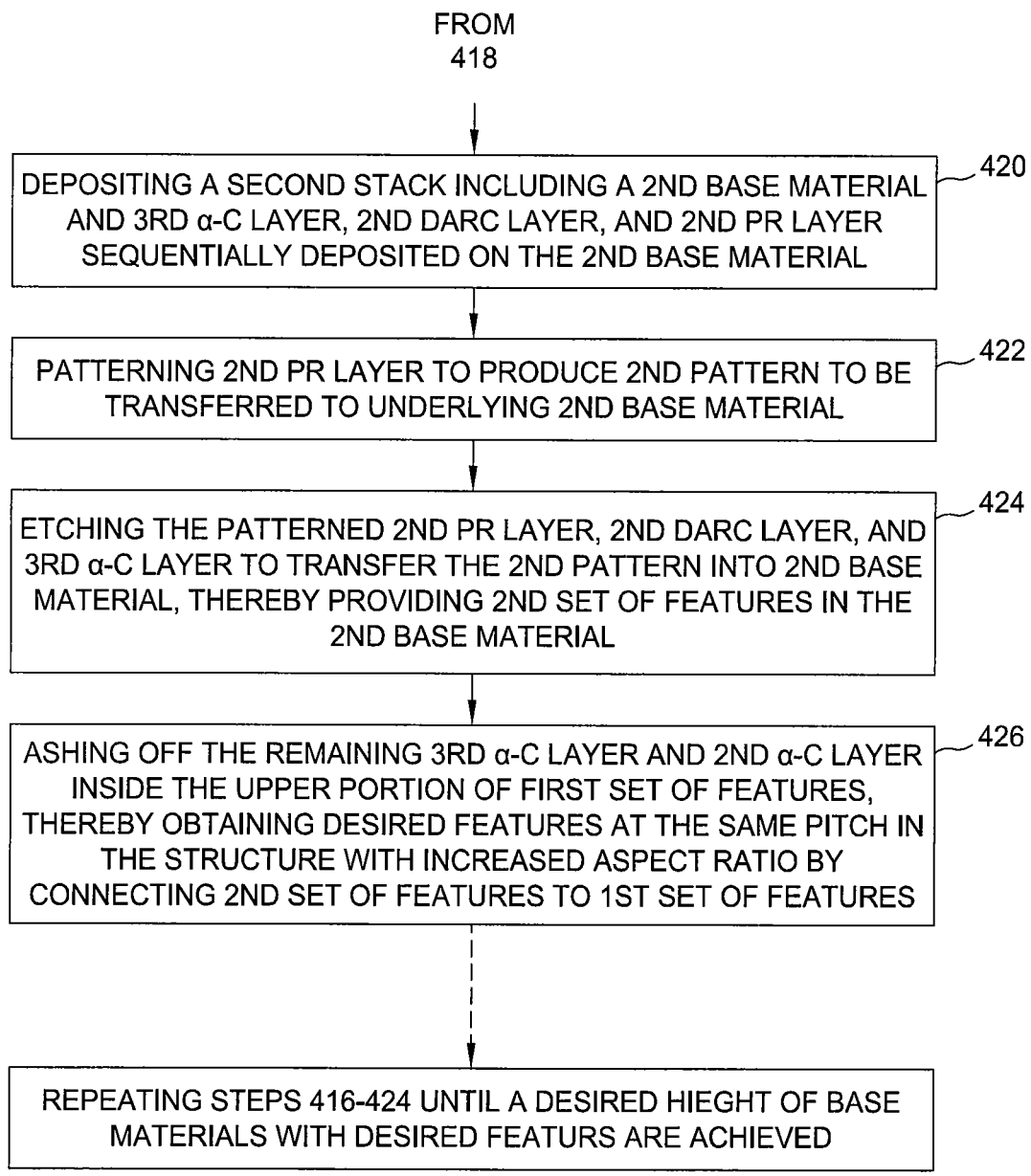

The inventive planarizing etch hardmask process has been proved to be effective in vertically scaling the aspect ratio of the interconnect features for various applications such as metal contacts, source/drain contacts, capacitor, or shallow trench isolations. FIG. 4 depicts a flow diagram of a deposition process 400 according to one embodiment of the present invention for increasing the aspect ratio of interconnect features in a desired film stacks. FIGS. 5A-5N depict a sequence of schematic, cross-sectional views of a film stack using the deposition process 400. It should be noted that the number and sequence of steps illustrated in FIG. 4 are not intended to limiting as to the scope of the invention described herein, since one or more steps can be added, deleted and/or reordered without deviating from the basic scope of the invention described herein. In addition, the drawings are not drawn to scale, and the proportions of certain features and the layer thickness have been exaggerated to better illustrate details and features of the invention.

The deposition process 400 starts at step 402 to provide a first stack 500 where a first amorphous carbon layer 520 is deposited on a first base material 510, as shown in FIG. 5A. Similar to step 202, the first base material 510 may be one or more materials used in forming semiconductor devices such as metal contacts, trench isolations, gates, bitlines, or any other interconnect features. The first base material 510 may include a silicon substrate material, an oxide material, a nitride material, a polysilicon material, or the like, depending upon application. In one embodiment where a memory application is desired, the first base material 510 may include, but is not limited to a silicon substrate material, an oxide material, a nitride material, and a polysilicon. In another embodiment where a DRAM capacitor application is desired, the first base material 510 may include a plurality of alternating oxide and nitride materials (i.e., oxide-nitride-oxide (ONO)) deposited on a surface of the substrate (not shown). The substrate may be any substrate or material surface upon which film processing is performed. For example, the substrate may be a material such as crystalline silicon, silicon oxide, strained silicon, silicon germanium, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, or other suitable workpieces.

Similar to step 202, the first amorphous carbon ($\alpha$-C) layer 520 is used as an etch hardmask due to its high etch resistance and easy removal and may be an Advanced Patterning Film™ (APF) material commercially available from Applied Materials, Inc. of Santa Clara, Calif. The process of forming the first amorphous carbon layer 520 is similar to those discussed previously and can be referred to step 202 in conjunction with FIG. 3A.

Steps 404 and 406 are similar to steps 204 and 206 discussed previously, where a first anti-reflective coating material 530 and a first photoresist layer 540 are subsequently deposited on the first amorphous carbon layer 520, as shown in FIGS. 5B and 5C. The first anti-reflective coating material 530 may be a DARC™ material layer commercially available from Applied Materials, Inc. of Santa Clara, Calif.

At step 408, the first photoresist layer 540 is then patterned by a lithographic process to produce a first pattern 542 in the patterned first photoresist layer 541 as shown in FIG. 5D. The first photoresist layer 540 is generally exposed through a mask, developed, and the undeveloped portion of the photoresist is removed, forming contact features 543 at a desired patch. The developed photoresist is generally a carbon-based polymer that remains as an etch mask on top of the first anti-reflective coating material 530 that is intended to be protected during an etch process. Similar to step 208, the patterned first photoresist layer 541 may have a desired line width "x" and a desired space "y" which together define the pitch "z" (i.e., line width plus space). In certain embodiments, the patterned first photoresist layer 541 may optionally be subjected to a trimming process, thereby, narrowing the width of the patterned photoresist materials to form a desired pattern defined by the trimmed first photoresist material. It is contemplated that the patterned first photoresist layer 541 may have any desired number of pitch in order to ultimately transfer a desired pattern into the first base material 510.

At step 410, the first pattern 542 formed in the patterned first photoresist layer 541 is transferred to the first amorphous carbon layer 520 to form a patterned first amorphous carbon layer 521 by first etching the first photoresist layer 541, the first anti-reflective coating material 530, and then the first amorphous carbon layer 520 with one or more etching processes as shown in FIG. 5E. The patterned first amorphous carbon layer 521 may perform as a hardmask for the underlying first base material 510.

At step 412, the first base material 510 is then etched using the patterned first amorphous carbon layer 521 as a hardmask with one or more etching processes or by a separate process to remove the remaining first anti-reflective coating material 531 and a portion of the first base material 510. The resulting first base material 510 has a first set of features 511, such as contact holes, transferred from the first pattern 542 in the patterned first photoresist layer 541 (FIG. 5D), with the remaining first amorphous carbon layer 521 deposited on the top surface of the first base material 510, as shown in FIG. 5F.

At step 414, after completion of the etch, the remaining first amorphous carbon layer 521 is removed by a suitable technique such as an $O_2$ ash optionally plus wet cleaning processes, resulting in the first base material 510 with the first set of features 511, as shown in FIG. 5G.

At step 416, a second amorphous carbon layer 560 is deposited on the patterned first base material 510 to protect the first set of features 511 from the subsequent processing steps, using a process similar to step 202 discussed previously. While the second amorphous carbon layer 560 can have full hole filling capability to gapfill the first set of features 511, it is advantageous in certain applications to not completely plug the first set of features 511. A SEM image of an exemplary example has demonstrated that gapfill capability of about 1000 Å to about 2000 Å of an Advanced Patterning Film™ (APF) material (i.e., amorphous carbon (α-C) layer) penetrating 60 nm contact holes to an extent that is sufficient for reliable protection of the features. The second amorphous carbon layer 560 filled in the first set of features 511 should be impervious to the subsequent depositions or etch resistant in the later stage while being easily removable when desired. In one embodiment, the second amorphous carbon layer 560 fills only the upper portion or top half of the first set of features 511. It is contemplated that other ashable materials may be used as long as it provides a reliable protection to the first set of features 511. In one embodiment, the ashable materials may include, but is not limited to carbon (in its various solid forms, graphite, diamond, diamond-like, amorphous, among others) and other organic materials such as hydrocarbon-containing polymers.

At step 418, the excessive second amorphous carbon materials remained on or above the surface of the first base material 510 is planarized by a suitable technique such as an ash process, such that an upper surface of the first base material 510 is at the same level with an upper surface of the second amorphous carbon material layer 560, thereby providing a substantial planar outer surface 562 of the first base material 510 as shown in FIG. 5I. The substantial planar outer surface 562 is desired since it allows for uniform deposition of the subsequent film stack.

At step 420, a second stack 550 to be patterned is deposited on the planarized surface of the first base material 510. Similar to the first stack 500, the second stack 550 may include a third amorphous carbon layer 570, a second anti-reflective coating material 580 and a second photoresist layer 590 sequentially deposited on a second base material 551, as shown in FIG. 5J, using the process similar to steps 402-406 discussed previously. The second base material 551 may be one or more materials used in forming semiconductor devices such as metal contacts, trench isolations, gates, bitlines, or any other interconnect features. The base material 510 may include a silicon substrate material, an oxide material, a nitride material, a polysilicon material, or the like, depending upon application. In one embodiment, the second base material 551 and the first base material 510 are of the same materials.

At step 422, the second photoresist layer 590 is then patterned using a lithographic process to produce a second pattern 592 to be transferred to the underlying second base material 551 as shown in FIG. 5K. In one embodiment, the second photoresist layer 590 is patterned in a manner such that the second pattern 592 is line up with the existing feature 511 in the first base material 510 that is filled and planarized with the second amorphous carbon layer 560.

At step 424, the second pattern 592 formed in the patterned second photoresist layer 591 is transferred to the second base material 551 using one or more etching processes similar to steps 410-414 to form a patterned second base material 552 as shown in FIG. 5L. The second base material 551 is etched using the patterned third amorphous carbon layer as a hardmask with one or more etching processes, or by a separate process to remove the remaining second anti-reflective coating material, a portion of third amorphous carbon layer, and a portion of the second base material 551. The resulting patterned second base material 552 therefore has a second set of features 512 (such as contact holes) transferred from the second pattern 592 in the patterned second photoresist layer 591 (FIG. 5K), where the second set of features 512 is aligned with the underlying second amorphous carbon layer 560 remained in the upper portion of the first set of features 511 in the first base material 510. In one embodiment, the etching process may continue to punch through the second amorphous carbon layer 560 remained in the upper portion of the first set of features 511. Alternatively, the etching process may stop when reaching the underlying second amorphous carbon layer 560 and then remove the second amorphous carbon layer 560 from the top half of the first set of features 511 in the subsequent ashing step, as discussed below at step 426.

At step 426, after completion of the etch, the remaining third amorphous carbon layer 571 (used as a hardmask) and the second amorphous carbon layer 560 plugged inside the upper portion or top half of the first set of features 511 are removed by a suitable technique such as an ash process, thereby obtaining desired features at the same pitch in the structure with an increased aspect ratio by extending or connecting the second set of features to the first set of features, as shown in FIG. 5M.

While the specification describes and shows formation of two film stacks (i.e., the first and second base materials with respective APF/DARC/Photoresist layers deposited thereon), the inventive processes may be repeated several times until a desired height of base materials with desired features are achieved. In one embodiment, the steps 416-424 are repeated twice to obtain at least four film stacks of base materials (e.g., 510, 552, 553, 554) with an aspect ratio being increased nearly double, as shown in FIG. 5N. With the increasing demand for high-volume electronics devices, the inventive planarizing etch hardmask process described herein advantageously provides the semiconductor device with a superior performance by nearly doubling the contact hole's aspect ratio.

It should be understood by those skilled in the art that the planarizing etch hardmask processes may be practiced in various approaches and should not be limited as described in conjunction with FIGS. 3 and 5. Any of the embodiments of processes provided herein can be used in combination with each other. For example, in a further embodiment the concept as described in conjunction with FIGS. 3 and 5 may be combined in any desired sequence to double the pattern density in a given region with a significantly increased aspect ratio. While the foregoing is directed to embodiments of the present invention, other and further embodiments of the invention may be devised without departing from the basic scope thereof, and the scope thereof is determined by the claims that follow.

The invention claimed is:

1. A method for processing a substrate in a processing chamber, comprising:
    providing a base material having a film stack deposited thereon, wherein the base material is formed over the substrate and having a first set of interconnect features formed therein, the film stack comprising:
        a hardmask layer contacting an upper surface of the base material;
        an anti-reflective coating layer deposited on the hardmask layer; and
        a photoresist layer deposited on the anti-reflective coating layer; and
    patterning the film stack to introduce into the hardmask layer a feature pattern to be transferred to the underlying base material, wherein the feature pattern is not aligned with the first set of interconnect features.

2. The method of claim 1, further comprising:
    transferring the feature pattern from the hardmask layer to the base material to form a second set of interconnect features in the base material, wherein the first and second sets of interconnect features have substantially identical feature size being arranged in parallel and equally spaced from each other in a given region; and
    removing the hardmask layer and any remaining materials from the first and second sets of interconnect features.

3. The method of claim 1, wherein the base material comprises a plurality of alternating oxide and nitride materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon.

4. The method of claim 1, further comprising:
    filling an upper portion of the first set of interconnect features with an ashable material; and
    planarizing the upper surface of the first base material such that an upper surface of the ashable material filled in the first set of interconnect features is at the same level with the upper surface of the first base material.

5. The method of claim 1, wherein patterning the film stack comprises:
    shifting laterally a projection of a mask on the photoresist layer relative to the substrate a predetermined distance to introduce the feature pattern into the photoresist layer.

6. The method of claim 1, wherein the base material comprises one or more oxide or nitride materials, aluminum, tungsten, or copper materials, polysilicon or amorphous silicon materials.

7. The method of claim 3, wherein the substrate comprise crystalline silicon, silicon oxide, strained silicon, silicon germanium, doped or undoped polysilicon, doped or undoped silicon, silicon on insulator (SOI), carbon doped silicon oxides, silicon nitrides, doped silicon, germanium, gallium arsenide, glass, sapphire, or the like.

8. The method of claim 1, wherein the hardmask layer is formed by flowing a hydrocarbon source and a dilution gas into the processing chamber at a hydrocarbon source to dilution gas flow ratio from about 1:10 to about 10:1.

9. The method of claim 8, wherein the hydrocarbon source comprises one or more hydrocarbon compounds having the general formula $C_xH_y$, wherein x has a range of between 1 and 20, and y has a range of between 1 and 20.

10. The method of claim 9, wherein one or more hydrocarbon compounds is selected from the group consisting of acetylene ($C_2H_2$), ethylene ($C_2H_4$), ethane ($C_2H_6$), propylene ($C_3H_6$), propyne ($C_3H_4$), propane ($C_3H_8$), butane ($C_4H_{10}$), butylene ($C_4H_8$), butadiene ($C_4H_6$) and combinations thereof.

11. The method of claim 10, wherein the hydrocarbon source is acetylene ($C_2H_2$).

12. The method of claim 1, wherein the hardmask layer fills an upper portion of the first set of interconnect features formed in the base material to an extent capable of protecting the first set of interconnect features from subsequent processes while being easily removable when desired.

13. The method of claim 1, wherein the hardmask layer does not completely plug the first set of interconnect features formed in the base material.

* * * * *

UNITED STATES PATENT AND TRADEMARK OFFICE
CERTIFICATE OF CORRECTION

PATENT NO. : 8,513,129 B2  Page 1 of 1
APPLICATION NO. : 12/790203
DATED : August 20, 2013
INVENTOR(S) : Seamons et al.

It is certified that error appears in the above-identified patent and that said Letters Patent is hereby corrected as shown below:

In the Specification:

Column 14, Line 18, please delete "51" and insert -- 5I -- therefor.

Signed and Sealed this
Fifteenth Day of October, 2013

Teresa Stanek Rea
*Deputy Director of the United States Patent and Trademark Office*